United States Patent [19]

Takahashi et al.

[11] Patent Number: 4,750,183
[45] Date of Patent: Jun. 7, 1988

[54] SEMICONDUCTOR LASER DEVICE

[75] Inventors: Kohsei Takahashi, Tenri; Toshiro Hayakawa, Nara; Takahiro Suyama; Masafumi Kondo, both of Tenri; Saburo Yamamoto, Nara, all of Japan

[73] Assignee: Sharp Kabushiki Kaisha, Osaka, Japan

[21] Appl. No.: 15,880

[22] Filed: Feb. 18, 1987

[30] Foreign Application Priority Data

Feb. 19, 1986 [JP] Japan .................. 61-35721

[51] Int. Cl.$^4$ .............................................. H01S 3/19
[52] U.S. Cl. ...................... 372/45; 372/44; 357/17
[58] Field of Search ....................... 372/45, 44; 357/17

[56] References Cited

U.S. PATENT DOCUMENTS 4,328,469 5/1982 Scifres et al. ................... 372/45

FOREIGN PATENT DOCUMENTS 0145686 8/1985 Japan ..................... 372/45
0145687 8/1985 Japan ..................... 372/45
2131610A 6/1984 United Kingdom ............ 258/14
2170044A 7/1986 United Kingdom ............. 15/61
21824892A 5/1987 United Kingdom .......... 429/88

Primary Examiner—James W. Davie
Assistant Examiner—Xuan T. Vo
Attorney, Agent, or Firm—Ciotti & Murashige, Irell & Manella

[57] ABSTRACT

An active layer for laser oscillation and optical guiding layers for guiding laser light sandwiching the active layer therebetween are included in the device. At least one of the optical guiding layers is formed by a superlattice, the optical refractive index of which is lower than that of the active layer. Further, the optical refractive index is gradually decreased in the direction from the portion of the optical guiding layer adjacent to the active layer, to the outside of the optical guiding layer.

3 Claims, 4 Drawing Sheets 28-n-$Al_{0.5}Ga_{0.5}As$ CURRENT BLOCKING LAYER
27-p-GaAs CAP LAYER
26-p-$Al_{0.7}Ga_{0.3}As$ CLADDING LAYER
25-AlAs/GaAs SUPERLATTICED GRIN GRINDING LAYER
24-$Al_{0.2}Ga_{0.8}As$ ACTIVE LAYER
23-AlAs/GaAs SUPERLATTICED GRIN GUIDING LAYER
22-n-$Al_{0.7}Ga_{0.3}As$ CLADDING LAYER
21-n-GaAs SUBSTRATE

- 28-n-$Al_{0.5}Ga_{0.5}As$ CURRENT BLOCKING LAYER
- 27-p-GaAs CAP LAYER
- 26-p-$Al_{0.7}Ga_{0.3}As$ CLADDING LAYER
- 25-AlAs/GaAs SUPERLATTICED GRIN GRINDING LAYER
- 24-$Al_{0.2}Ga_{0.8}As$ ACTIVE LAYER
- 23-AlAs/GaAs SUPERLATTICED GRIN GUIDING LAYER
- 22-n-$Al_{0.7}Ga_{0.3}As$ CLADDING LAYER
- 21-n-GaAs SUBSTRATE

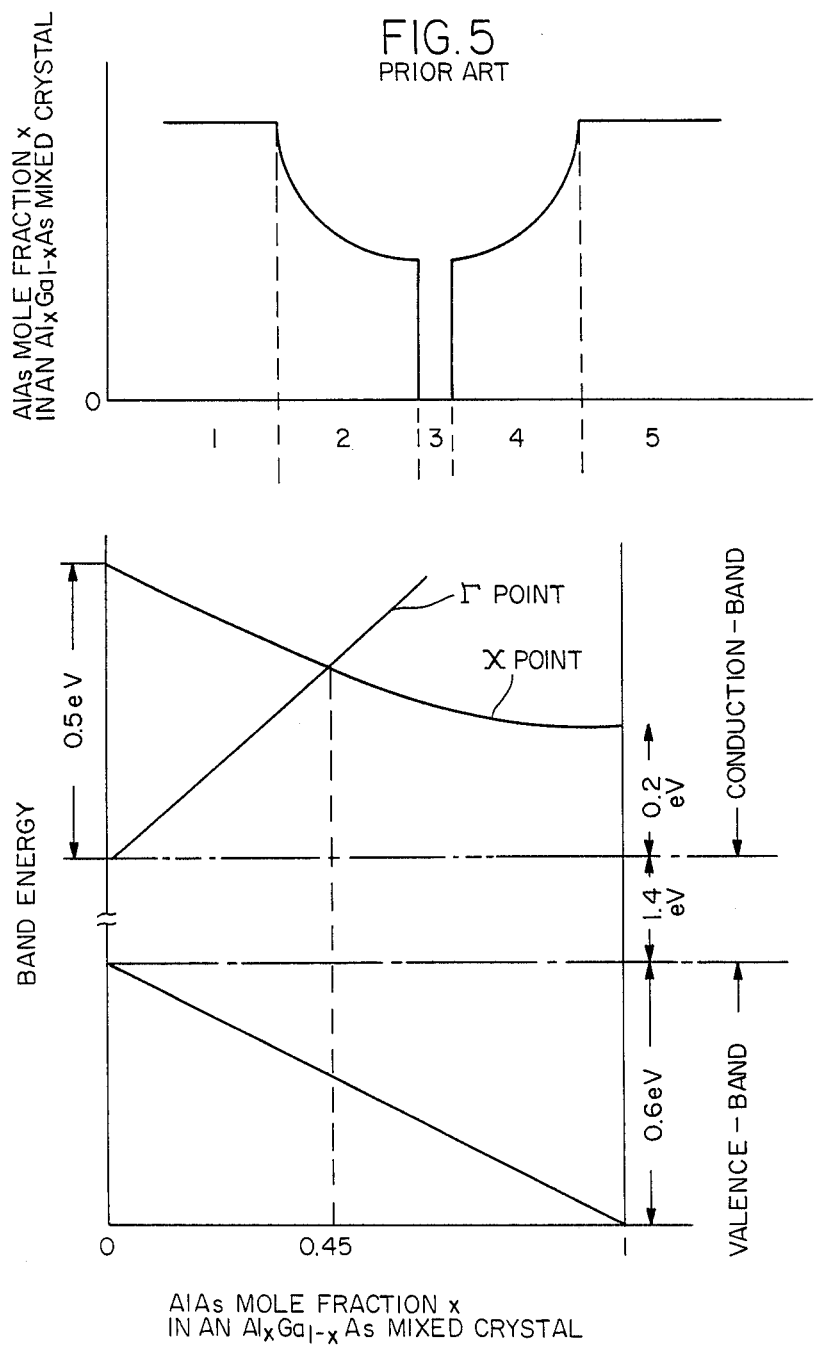

SEMICONDUCTOR LASER DEVICE

BACKGROUND OF THE INVENTION

1. Field of the Invention

This invention relates to a semiconductor laser device which oscillates laser light with an oscillation wavelength in the visible region, especially, a high quality semiconductor laser device which can be readily produced by molecular beam epitaxy.

2. Description of the Prior Art

In recent years, single crystal thin film growth techniques such as molecular beam epitaxy (MBE) and metal organic-chemical vapor deposition (MO-CVD), have rapidly improved. By these growth techniques, it is possible to obtain epitaxial growth layers of extreme thinness, on the order of 10 Å. Due to the progress in these crystal growth techniques, it is possible to make laser devices based on device structures having very thin layers, which could not be easily manufactured by conventional liquid phase epitaxy. A typical example of these laser devices is the quantum well (QW) laser, in which the active layer has a thickness of 100 Å or less resulting in the formation of quantum levels therein, whereas the active layer of the conventional double-heterostructure (DH) laser has a thickness of several hundreds of angstroms or more. Thus, this QW laser is advantageous over the conventional DH laser in that the threshold current level is reduced, the temperature characteristics are excellent, and the transient characteristics are excellent. This has been reported by W. T. Tsang, Applied Physics Letters, vol. 39, No. 10, p. 786 (1981); N. K. Dutta, Journal of Applied Physics, vol. 53, No. 11 p. 7211 (1982); and H. Iwamura, T. Saku, T. Ishibashi, K Otsuka, Y. Horikoshi, Electronics Letters, vol. 19, No. 5, p. 180 (1983).

As mentioned above, by the use of single thin crystal film growth techniques such as MBE and MO-CVD, it is now possible to put high quality semiconductor lasers having a new multiple-layered structure into practical use.

A typical structure for conventional QW lasers is the AlGaAs laser with a graded-index separate-confinement heterostructure (GRIN-SCH). The AlAs mole fraction (i.e., x) in an $Al_xGa_{1-x}As$ mixed crystal in the active region of these GRIN-SCH lasers is shown in FIG. 5. These GRIN-SCH lasers have a cladding layer 1, an optical guiding layer 2, a quantum well active layer 3, an optical guiding layer 4 and a cladding layer 5 in that order, wherein the recombination of carrier arises in the quantum well active layer 3, resulting in laser oscillation, which causes laser light. The laser light is guided by the optical guiding layers 2 and 4.

In order that the laser light is guided by the optical guiding layers 2 and 4 in the GRIN-SCH lasers, sufficient differences Δn in the refractive index between the quantum well active layer 3 and the optical guiding layer 2 and between the quantum well active layer 3 and the optical guiding layer 4 must be created in such a manner that the refractive index of each of the optical guiding layers 2 and 4 is greater than that of the quantum well active layer 3 positioned between these optical guiding layers 2 and 4. For this reason, sufficient differences in the AlAs mole fraction (i.e., x) must be created in the direction from the quantum well active layer 3 to each of the optical guiding layers 2 and 4. On the other hand, when a visible light semiconductor laser device oscillating laser light with a short oscillation wavelength is produced with the said GRIN-SCH laser structure, the carrier must be sufficiently confined within the quantum well active layer 3, which causes the necessity of a sufficiently high quantum well barrier.

FIG. 6 shows the dependence of the relative height of both the conduction-band edge and the valence-band edge in an $Al_xGa_{1-x}As$ mixed crystal on the AlAs mole fraction (i.e., x) in the $Al_xGa_{1-x}As$ mixed crystal. The height of the conduction-band edge and the valence-band edge shown in FIG. 6 is determined based on the experimental data that the band discontinuities of the conduction-band and the valance-band are distributed with a proportion of 60% and 40% at the hetero-interface between the two different $Al_xGa_{1-x}As$ mixed crystals.

It can be seen from FIG. 6 that when x is smaller than 0.45 (i.e., x<0.45), the conduction-band edge is the direct transition region at the Γ point and linearly increases with an increase in x, and that when x is greater than 0.45 (i.e., x>0.45), the X point of the indirect transition region forms the conduction-band edge and gradually decreases with an increase in x. These phenomena are referred to in the following references: H. Kroemer, The 2nd International Conference on Modulated Semiconductor Structures V-(24), p. 797(1985); H. C. Casey and M. B. Panish, Heterostructure Lasers (Acedemic Press, 1978); M. O. Watanabe et al., J. Appl. Phys. 57, p. 5340(1985); D. Arnold et al., Appl. Phys. Lett. 44, p. 1237(1984).

Thus, in order to create a sufficiently high quantum well barrier, it is necessary to make the AlAs mole fraction (i.e., x) sufficiently high in the portion of each of the optical guiding layers 2 and 4 in the vicinity of the quantum well active layer 3 positioned between these optical guiding layers 2 and 4. Moreover, in order to effectively achieve the confinement of laser light within the quantum well active layer 3, it is necessary for the AlAs mole fraction, which is higher than that of the above-mentioned portion of each of the optical guiding layers 2 and 4, to be set in the portion of each of the optical guiding layers 2 and 4 in the vicinity of the cladding layers 1 and 5 positioned outside of the optical guiding layers 2 and 4. For this purpose, it is necessary to use a mixed crystal in the indirect transition region, the AlAs mole fraction (i.e., x) of which is 0.45 or more, for the optical guiding layers 2 and 4. However, when such a mixed crystal in the indirect transition region is used for the optical guiding layers 2 and 4, the following problems arise:

FIG. 7 shows the conduction-band energy in the active region of a GRIN-SCH laser in which the optical guiding layers 2 and 4 are formed by an $Al_xGa_{1-x}As$ mixed crystal in which x is greater than 0.45 (i.e., x>0.45), wherein the optical guiding layers 2 and 4, respectively, have an AlAs mole fraction x with gradual changes from 0.7 to 0.45 in the direction from the outside of each of the optical guiding layers 2 and 4 to the GaAs active layer 3 positioned between the optical guiding layers 2 and 4. FIG. 7 indicates that when electrons are injected from the optical guiding layers 2 and 4 into the active layer 3, the conduction-band edge of each of the optical guiding layers 2 and 4 becomes higher in the direction from the outside of each of the optical guiding layers 2 and 4 to the GaAs active layer 3, so that these optical guiding layers 2 and 4 function as a barrier against the electrons. This means that when an $Al_xGa_{1-x}As$ mixed crystal having an AlAs mole fraction x (wherein x>0.45) is used for the optical guiding layers 2 and 4, the greater difference $\Delta n$ in the refractive index between the active layer 3 and each of the optical guiding layers 2 and 4 is set in order to effectively confine laser light within the active layer 3, the higher barrier is created against the electrons to be injected, which causes the lowering of the electron injection efficiency. Therefore, so long as an $Al_xGa_{1-x}As$ mixed crystal in the indirect transition region is employed for the optical guiding layers, it is difficult to simultaneously achieve the complete confinement of light within the active layer and the highly efficient injection of carrier from the optical guiding layers into the active layer. FIG. 8 shows a sectional view of the GRIN-SCH laser device shown in FIG. 5. The GRIN-SCH laser device is produced as follows: On an n-GaAs substrate 10, n-$Al_xGa_{1-x}As$ (x=0.7) cladding layer 1, non-doped $Al_xGa_{1-x}As$ GRIN optical guiding layer 2 in which the AlAs mole fraction x is gradually decreased from 0.7 to 0.3, non-doped GaAs active layer 3, non-doped $Al_xGa_{1-x}As$ GRIN optical guiding layer 4 in which the AlAs mole fraction x is gradually increased from 0.3 to 0.7, p-$Al_xGa_{1-x}As$ (x=0.7) cladding layer 5, a p-GaAs cap layer 6, and an $Al_{0.5}Ga_{0.5}As$ current blocking layer 7 are successively grown. Thereafter, the current blocking layer 7 is subjected to a mask-etching treatment to form a stripe having a width of 5 μm, resulting in a striped semiconductor laser device.

SUMMARY OF THE INVENTION

The semiconductor laser device of this invention, which overcomes the above-discussed and numerous other disadvantages and deficiencies of the prior art, comprises an active layer for laser oscillation and optical guiding layers for guiding laser light sandwiching said active layer therebetween, wherein at least one of said optical guiding layers is formed by a superlattice, the optical refractive index of which is lower than that of the active layer and is gradually decreased in the direction from the portion of said optical guiding layer adjacent to the active layer to the outside of said optical guiding layer.

In a preferred embodiment, the superlatticed optical guiding layer is composed of alternate layers consisting of a plurality of $Al_xGa_{1-x}As$ layers, the thickness of each of which is $L_B$, and a plurality of $Al_yGa_{1-y}As$ layers ($1 \geq x > y \geq 0$), the thickness of each of which is $L_z$, the layer thicknesses $L_B$ and $L_Z$, respectively, are equal to or less than the mean free-path of the carrier, and said optical refractive index of the superlatticed optical guiding layer is determined depending upon the average AlAs mole fraction $x_{eff}$ in the $Al_xGa_{1-x}As$ and $Al_yGa_{1-y}As$ mixed crystals of each of the alternate layers constituting the superlatticed optical guiding layer that is represented by the formula: $x_{eff}=(L_B \cdot x + L_Z \cdot y)/(L_B+L_Z)$, whereby said gradual decrease in the optical refractive index of the superlatticed optical guiding layer is achieved by gradual changes in the layer thicknesses $L_B$ and $L_Z$.

In a preferred embodiment, the superlatticed optical guiding layer comprises the portion having the value of $x_{eff}$ which is equal to the AlAs mole fraction in an AlGaAs mixed crystal in the indirect transition region where the band energy at the X point of the conduction-band of the AlGaAs mixed crystal is lower than that at the Γ point of the conduction-band of the AlGaAs mixed crystal, and moreover the layer thickness $L_B$ of the portion of the superlatticed optical guiding layer having a greater value of $x_{eff}$ is smaller than that of the portion of the superlatticed optical guiding layer having a smaller value of $x_{eff}$, whereby the quantum level at the X point of the lower edge of the conduction-band of said portion having the greater value of $x_{eff}$ becomes higher than that at the X point of the lower edge of the conduction-band of said portion having the smaller value of $x_{eff}$.

In a more preferred embodiment, the quantum level at the X point of the lower edge of the conduction-band of at least the portion of said superlatticed optical guiding layer having the greatest value of $x_{eff}$ is lower than that at the Γ point of the lower edge of the conduction-band thereof.

Thus, the invention described herein makes possible the object of providing a GRIN-SCH semiconductor laser device which simultaneously achieves the complete confinement of light within the active layer and the injection of carrier with a high efficiency from the optical guiding layers into the active layer.

BRIEF DESCRIPTION OF THE DRAWINGS

This invention may be better understood and its numerous objects and advantages will become apparent to those skilled in the art by reference to the accompanying drawings as follows:

FIG. 5 is a graph showing the AlAs mole fraction (i.e., x) in an $Al_xGa_{1-x}As$ mixed crystal of a conventional GRIN-SCH laser device.

FIG. 6 is a graph showing the dependence of the band energy of each of the conduction-band and the valence-band of an $Al_xGa_{1-x}As$ mixed crystal on the AlAs mole fraction x in the $Al_xGa_{1-x}As$ mixed crystal.

DESCRIPTION OF THE PREFERRED EMBODIMENTS

Figure 2:
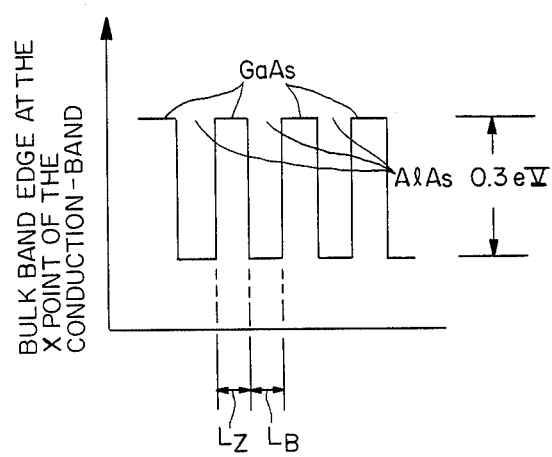
FIG. 2 is a graph showing the distribution of the bulk band edge at the X point of the conduction-band of an AlAs/GaAs superlattice.
Figure 3:
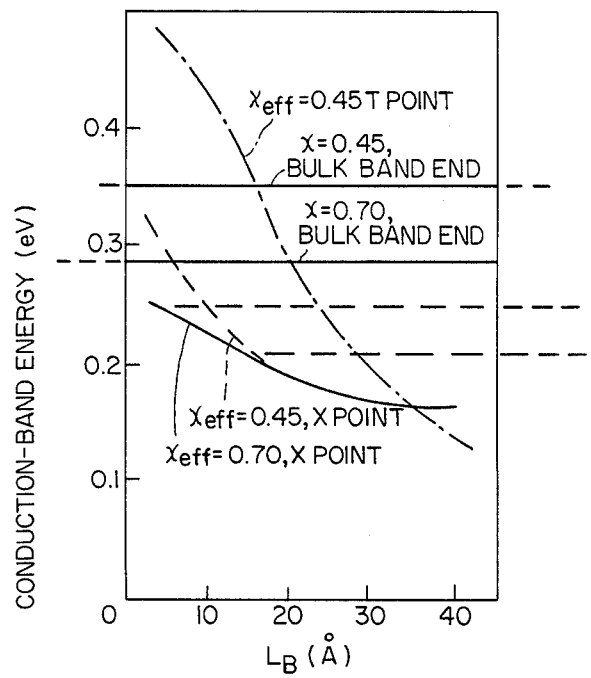
FIG. 3 is a graph showing the height of the conduction-band edge of an AlAs/GaAs superlattice.

In order to more easily understand the operation of the semiconductor laser device of this invention, the conduction-band edge of a superlattice which is applied to the optical guiding layers of this laser device is described below, first:

FIG. 3 shows the conduction-band edge of a superlattice which is composed of alternate layers consisting of a plurality of AlAs layers (the thickness of each of which is $L_B$) and a plurality of GaAs layers (the thickness of each of which is $L_Z$), wherein the values of $L_B$ and $L_Z$, respectively, are equal to or less than the mean free-path of the carrier. More particularly, FIG. 3 shows the conduction-band energy at both the X point and the Γ point in the case that $L_B$ (and $L_Z$) is changed with the average AlAs mole fraction $x_{eff}$, e.g., 0.45 or 0.7, of each of the alternate layers constituting the superlatticed optical guiding layers. FIG. 3 also shows the conduction-band energy of bulk $Al_xGa_{1-x}As$ mixed crystals (wherein x=0.45 and 0.7) for reference. The band edge of the superlattice constituted by the quantum levels at the X point in the indirect transition region was calculated by the Kronig-Penney model under the conditions that the average AlAs mole fraction $x_{eff}$ ($=L_B/(L_B+L_Z)$) in an $Al_xGa_{1-x}As$ mixed crystal of each of the alternate layers of the superlattice is fixed to be 0.45 and 0.70, and the value of $L_B$ (and $L_Z$) is changed to be in the range of less than 50 Å. The allowable energy of the superlattice at the X point is determined by the periodical potential which is produced by a difference in the height of the band edge at the X point between the AlAs and the GaAs. As seen from FIG. 6, the band energy at the X point of the conduction-band is decreased with an increase in the AlAs mole fraction x in the $Al_xGa_{1-x}As$ mixed crystal, so that with the conduction-band of an AlAs/GaAs superlattice, each AlAs crystal constitutes a well and each GaAs constitutes a barrier as shown in FIG. 2.

FIG. 3 indicates that the conduction-band energy of a superlattice can be controlled over a wide range under the condition that the average AlAs mole fraction $x_{eff}$ of each of the alternate layers constituting the superlattice is fixed at a certain value. Moreover, light to be guided within a semiconductor laser device can be controlled by a refractive index, which is determined depending upon the above-mentioned average AlAs mole fraction $x_{eff}$ when the pitch, $L_B+L_Z$, of the superlattice is extremely small, 100 Å or less. Accordingly, it is understood that the optical refractive index of a superlattice can be controlled independently of the height of the band edge against the carrier. If these characteristics of a superlattice are applied to the optical guiding layers of a GRIN-SCH laser device having a mixed crystal composition, the average AlAs mole fraction $x_{eff}$ of which is greater than 0.45 (i.e., $x_{eff}>0.45$), it will be possible to avoid the formation of a barrier against the carrier to be injected. Therefore, if an optical guiding layer constituted by a superlattice is disposed on at least one side of the active layer for laser oscillation, the resulting GRIN-SCH semiconductor laser device will be able to simultaneously achieve the complete confinement of light within the active layer and highly efficient injection of carrier from the optical guiding layers into the active layer, which cannot be achieved by a conventional GRIN-SCH laser device having the optical guiding layers with an AlAs mole fraction x of greater than 0.45 (i.e., $x>0.45$).

That is, a superlatticed optical guiding layer composed of alternate layers, the average AlAs mole fractions $x_{eff}$ of which are gradually increased from the portion of the superlatticed optical guiding layer in the vicinity of the active layer to the outside of the superlatticed optical guiding layer, is disposed on at least one side of the active layer to thereby increase the optical refractive index of the superlatticed guiding layer, resulting in the confinement of laser light within the active layer. Moreover, the thickness $L_B$ of each layer unit constituting the superlatticed optical guiding layer is gradually decreased in the direction from the portion of the superlatticed optical guiding layer in the vicinity of the active layer to the outside of the superlatticed optical guiding layer to thereby raise the band energy at the X point of the conduction-band of the superlattice, resulting in the injection of carrier with a high efficiency from the superlatticed optical guiding layer into the active layer.

In order to achieve the above-mentioned effects, the superlattice can be designed with the use not only of the AlAs/GaAs superlattice mentioned above, but also of a superlattice constructed by two kinds of mixed crystal such as an $Al_xGa_{1-x}As$ mixed crystal and an $Al_yGa_{1-y}As$ ($1 \geq x > y \geq 0$; $x > 0.45$) mixed crystal, wherein $x_{eff}=(L_B \cdot x + L_Z \cdot y)/(L_B+L_Z)$.

Such a superlattice having an extremely thin thickness as mentioned above can be easily produced by molecular beam epitaxy.

EXAMPLE

Figure 1:
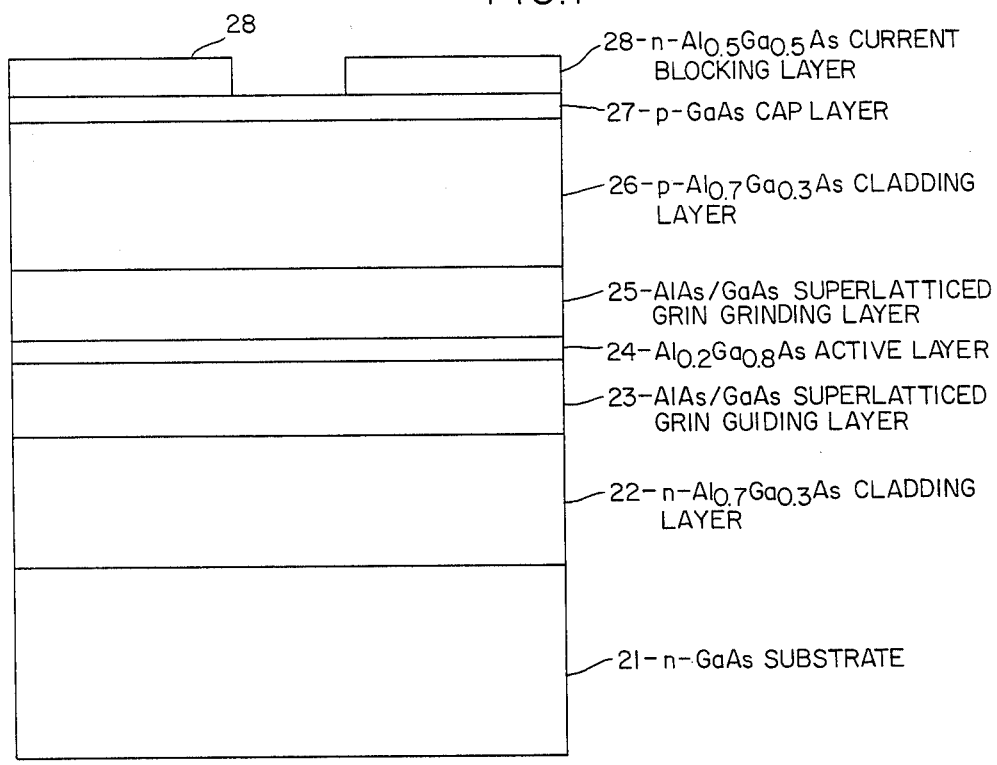
FIG. 1 is a front sectional view showing a GRIN-SCH laser device of this invention, in which each of the optical guiding layers is constituted by a superlattice.
Figure 4:
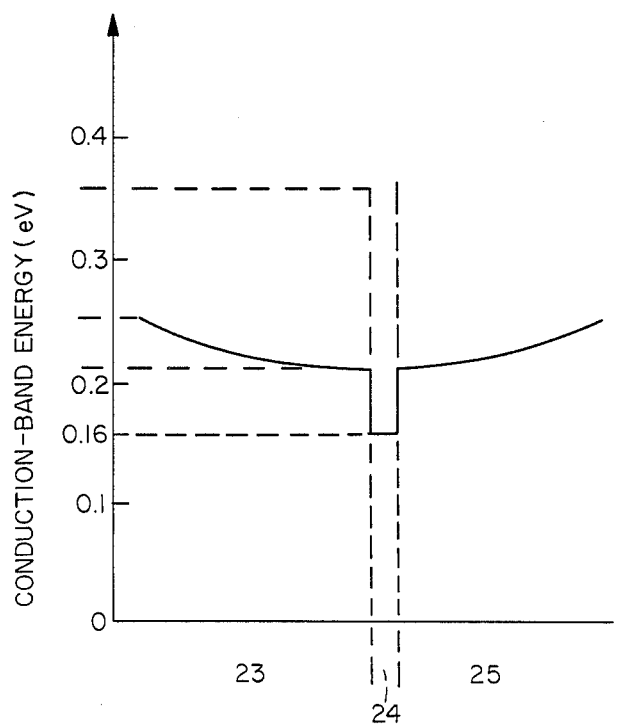
FIG. 4 is a graph showing the conduction-band energy of a GRIN-SCH laser device of this invention having the optical guiding layers constituted by a superlattice shown in FIG. 5.

FIG. 1 shows a visible light GRIN-SCH laser device having an active layer for laser oscillation and superlatticed optical guiding layers sandwiching the active layer therebetween, which is produced as follows: On an n-GaAs substrate 21, an n-$Al_xGa_{1-x}As$ cladding layer (x=0.7; Si=$5 \times 10^{17}$ cm$^{-3}$; the thickness thereof being 1.5 μm) 22, a non-doped AlAs/GaAs superlatticed GRIN guiding layer (the thickness thereof being 0.2 μm) 23, a non-doped $Al_xGa_{1-x}As$ quantum well active layer (x=0.2; the thickness thereof being 70 Å) 24, a non-doped AlAs/GaAs superlatticed GRIN guiding layer (the thickness thereof being 0.2 μm) 25, a p-$Al_xGa_{1-x}As$ cladding layer (x=0.7; Be=$5 \times 10^{17}$ cm$^{-3}$; the thickness thereof being 1.5 μm) 26, a p-GaAs cap layer (Be=$5 \times 10^{17}$ cm$^{-3}$; the thickness thereof being 0.5 μm) 27, and an n-$Al_xGa_{1-x}As$ current blocking layer (x=0.5; the thickness thereof being 0.6 μm) 28 are successively grown by molecular beam epitaxy. The thickness $L_B$ and $L_Z$ of the portions of the superlatticed GRIN guiding layers 23 and 25, which are adjacent to the cladding layers 22 and 26, respectively, are 2.83 Å and 1.21 Å, respectively, and the value of $x_{eff}$ of each of the said portions thereof is 0.7, whereas the thicknesses $L_B$ and $L_Z$ of the portions of the superlatticed GRIN guiding layers 23 and 25, which are adjacent to the active layer 24 are 15.6 Å and 19.1 Å, respectively, and the value of $x_{eff}$ of each of the said portions thereof is 0.45. The thicknesses $L_B$ and $L_Z$ of the alternate layers constituting each of the superlatticed GRIN guiding layers 23 and 25 are gradually increased toward the active layer 24 in such a manner that the values of $x_{eff}$ of the alternate layers are continuously changed from 0.7 to 0.4. The profile of the conduction-band edge of the above-mentioned GRIN-SCH structures 23 to 25 is shown in FIG. 4, wherein the quantum level of the active layer 24 is at the height indicated by dotted line because it is determined based on the Γ point of the direct transition region. FIG. 4 indicates that, with the superlatticed GRIN-SCH structure, electrons naturally fall from the higher energy portion into the lower energy portion, and they are finally injected into the lowest energy potion, i.e., the active layer 24. The device of FIG. 4 has optical guiding layers constituted by a superlatticed shown in FIG. 5. More specifically, FIG. 5 shows the AlAs mole fraction, x, in an $Al_xGa_{1-x}As$ mixed crystal of a conventional GRIN-SCH laser device.

Thereafter, the current blocking layer 28 is subjected to a mask-etching treatment to form a stripe having a width of 5 μm therein, resulting in a striped semiconductor laser device having a cavity length of 250 μm, which oscillated laser light having an oscillation wavelength λ of 700 μm at a threshold current Ith of 80 mA.

Figure 7:
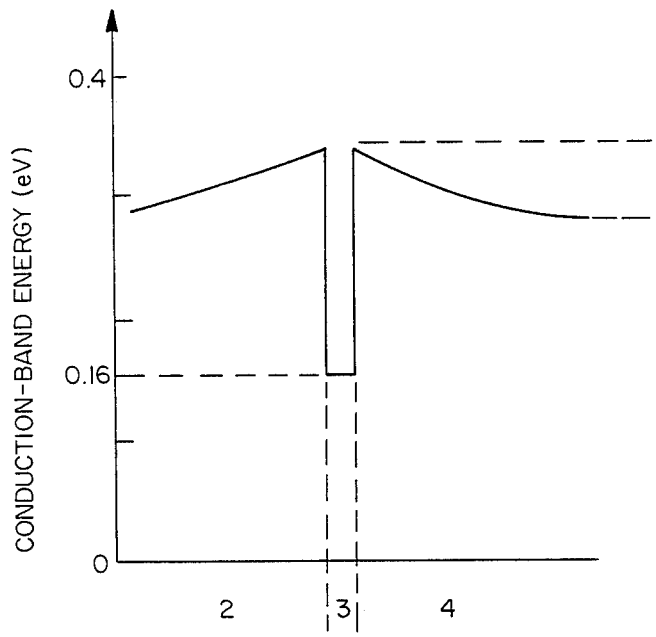
FIG. 7 is a graph showing the conduction-band energy of a conventional GRIN-SCH laser device having the optical guiding layers made of a mixed crystal.
Figure 8:
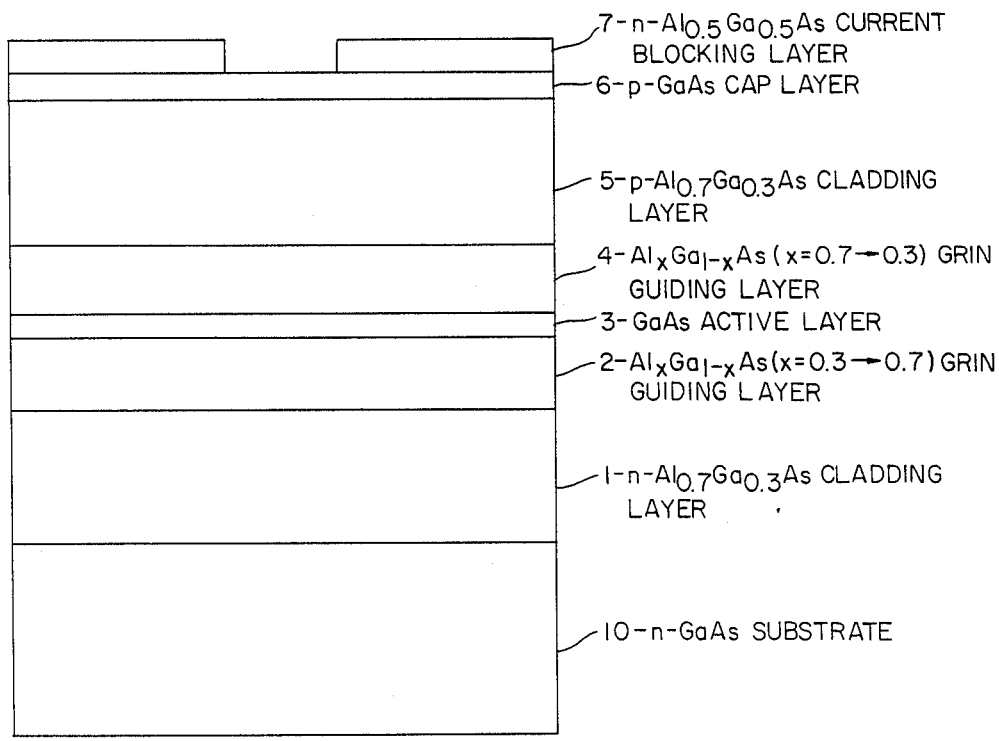
FIG. 8 is a front sectional view of the GRIN-SCH laser device shown in FIG. 5.

For a comparison of the above-mentioned laser device of this invention, a reference standard striped laser device was produced in the same manner as the above-mentioned striped laser device of this invention except that the GRIN guiding layers 23 and 25 shown in FIG. 1 were formed by a bulk $Al_xGa_{1-x}As$ mixed crystal in which x was gradually varied from 0.7 to 0.45. The reference standard striped laser device oscillated laser light having an oscillation wavelength λ of 700 μm at a threshold current Ith of 120 mA. The conduction-band edge of these GRIN guiding layers of this reference standard laser device is shown in FIG. 7, indicating that electrons must rise from the lower energy portion to the higher energy portion, first, in order to be injected into the active layer. Therefore, the threshold current Ith of this reference standard laser device becomes significantly higher than that of the laser device of this invention.

Although the above-mentioned example only discloses the cladding layers 22 and 26 made of an $Al_xGa_{1-x}As$ mixed crystal in which x is 0.7, this invention is, of course, applicable to cladding layers made of an AlAs/GaAs superlattice in which $x_{eff}$ is 0.7. Moreover, the GRIN layer on the p-cladding layer side shown in FIG. 1 is not necessarily constituted by a superlattice, but it can be formed by a bulk mixed crystal.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

We claim:

1. In a semiconductor laser device comprising an active layer for laser oscillation and optical guiding layers for guiding laser light sandwiching said active layer therebetween, at least one of said optical guiding layers being formed by a superlattice, the optical refractive index of which is lower than that of the active layer and is gradually decreased in the direction from the portion of said optical guiding layer adjacent to the active layer to the outside of said optical guiding layer, said superlatticed optical guiding layer being composed of alternate layers consisting of a plurality of $Al_xGa_{1-x}As$ layers, the thickness of each of which is $L_B$, and a plurality of $Al_yGa_{1-y}As$ layers ($1 \geq x > y \geq 0$), the thickness of each of which is $L_Z$, the layer thicknesses $L_B$ and $L_Z$, respectively, are equal to or less than the mean free-path of the carrier, and said optical refractive index of the superlatticed optical guiding layer being determined depending upon the average AlAs mole fraction $x_{eff}$ in the $Al_xGa_{1-x}As$ and $Al_yGa_{1-y}As$ mixed crystals of each of the alternate layers constituting the superlatticed optical guiding layer that is represented by the formula: $x_{eff} = (L_B'x + L_Z'y)/(L_B + L_Z)$, whereby said gradual decrease in the optical refractive index of the superlatticed optical guiding layer is achieved by gradual changes in the layer thicknesses $L_B$ and $L_Z$.

2. A semiconductor laser device according to claim 1, wherein said superlatticed optical guiding layer comprises the portion having the value of $x_{eff}$ which is equal to the AlAs mole fraction in an AlGaAs mixed crystal in the indirect transition region where the band energy at the X point of the conduction-band of the AlGaAs mixed crystal is lower than that at the Γ point of the conduction-band of the AlGaAs mixed crystal, and moreover the layer thickness $L_B$ of the portion of the superlatticed optical guiding layer having a greater value of $x_{eff}$ is smaller than that of the portion of the superlatticed optical guiding layer having a smaller value of $x_{eff}$; whereby the quantum level at the X point of the lower edge of the conduction-band of said portion having the greater value of $x_{eff}$ becomes higher than that at the X point of the lower edge of the conduction-band of said portion having the smaller value of $x_{eff}$.

3. A semiconductor laser device according to claim 2, wherein the quantum level at the X point of the lower edge of the conduction-band of at least the portion of said superlatticed optical guiding layer having the greatest value of $x_{eff}$ is lower than that at the Γ point of the lower edge of the conduction-band thereof.

* * * * *